(12) United States Patent
Daniel (10) Patent No.: US 7,790,219 B2
(45) Date of Patent: Sep. 7, 2010

(54) PRINTED COMPONENT CIRCUIT WITH FLUIDIC TEMPLATE

(75) Inventor: Jurgen H. Daniel, San Francisco, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 928 days.

(21) Appl. No.: 11/615,353

(22) Filed: Dec. 22, 2006

(65) Prior Publication Data

US 2008/0149934 A1 Jun. 26, 2008

(51) Int. Cl.
*B05D 1/26* (2006.01)
*H01L 51/00* (2006.01)
*H01L 21/00* (2006.01)

(52) U.S. Cl. .......................... 427/98.5; 438/99; 257/40

(58) Field of Classification Search .................. 257/40; 427/58; 438/99

See application file for complete search history.

(56) References Cited

U.S. PATENT DOCUMENTS 7,176,617 B2 * 2/2007 Endo et al. .................. 313/504
2006/0065897 A1 * 3/2006 Hirai et al. .................... 257/72

OTHER PUBLICATIONS

Etsuko Shioya, Tomoyjki Kamakura, Keisuke Yamada, Yoshiuki Yagami, Wakao Miyazawa, Satoshi Inoue and Tatsuya Shimoda, "48:1: LTPS TSTs with Metal Electrodes Formed by Inkjet Printing Technology," SID 06 Digest, pp. 1575-1578.

J.Z. Wang, J. Gu, F. Zenhausem, H. Sirringhaus, "Los-cost fabrication of submicron all polymer field effect transistors," Applied Physics Letters 88, 133502 (2006) (3 pages).

Michael L. Chabinyc, William S. Wong, Kateri E. Paul and Robert A. Street, "Fabrication of Arrays of Organic Polymeric Thin-Flim Transistors Using Self-Aligned Microfluidic Channels," Advanced Materials 2003, 15, No. 22, Nov. 17, pp. 1903-1907.

* cited by examiner

*Primary Examiner*—Evan Pert
(74) *Attorney, Agent, or Firm*—Marger Johnson & McCollom, P.C.

(57) ABSTRACT

A method forms a plurality of pillars, the pillars arranged such that positions of the pillars control flow of a liquid, the plurality of pillars forming a fluidic template, the method dispenses the liquid into the fluidic template such that the liquid assumes a shape corresponding to the fluidic template, and dries the liquid to form at least a portion of a patterned structure. Another method forms a multi-layer printed structure by forming a plurality of pillars, the pillars arranged such that positions of the pillars control flow of a liquid, the plurality of pillars forming a fluidic template, dispensing a first liquid into a first region containing the pillars such that liquid spreads only in the first region, dispensing a second liquid into a second region such that liquid spreads in the second region and partially into the first region, forming an overlap region, an extent of the overlap region controlled by the positions of the pillars. A structure has a fluidic template formed from a plurality of pillars, a first layer of a first dispensed material form in a first region of the fluidic template, a second layer of a second dispensed material formed in a second region of the fluidic template, and an overlap region formed from at least some of the plurality of pillars, the pillars arranged to control an extent of the overlap region, the structure formed from the second layer formed on the first layer.

22 Claims, 6 Drawing Sheets

PRINTED COMPONENT CIRCUIT WITH FLUIDIC TEMPLATE

BACKGROUND

It is possible to print electronic circuits using familiar printing techniques such as ink jet printing. A printhead can deposit circuit materials similarly to how it would deposit ink onto a surface. A circuit or component designer provides the layout of the circuit or component to the printer and the printer forms the circuit or component on a circuit substrate using printing techniques.

For purposes of discussion here, circuits, generally a collection of electronic components in electrical connection with each other, and components, individual electronic structures, will be referred to as circuits. Similarly, a printer would be any type of fluid dispensing system that can deliver liquids suitable for forming circuits based upon some layout or direction for forming the circuit. A circuit substrate may be any carrier or other surface upon which the circuit is formed.

Formation of electronic circuits with printing techniques may have issues with exact definition of structures due to surface tension effects in the dispensed liquid, inaccurate drop placement, or because of the rounded edges of current printed structures. Lines are not exactly straight, with visible scalloping from placement of the individual drops, and squares or rectangles have rounded edges. It is also difficult to print narrow lines and narrow spaces. These problems result in variations in the formations of the circuits. Variations in the formation of the circuits may result in variations in the circuit performance.

In one example of problems caused by variations in the formation of the circuits, displays produced using printed circuits may have variations in the charging times (RC charging time) for the addressing of the pixels in the display. These variations cause differences between pixels in the resulting image, especially in gray scale images. In gray scale images, the resulting gray level of a pixel depends upon how long the pixel is active within a particular period of time. Variations in how long it takes a pixel to charge cause variations in the gray level that are undesirable and uncontrolled, degrading image quality.

SUMMARY

A first embodiment is a method that forms a plurality of pillars, the pillars arranged such that positions of the pillars control flow of a liquid, the plurality of pillars forming a fluidic template, the method dispenses the liquid into the fluidic template such that the liquid assumes a shape corresponding to the fluidic template, and the method dries the liquid to form at least a portion of a printed structure.

Another embodiment is a method that forms a multi-layer printed structure by forming a plurality of pillars, the pillars arranged such that positions of the pillars control flow of a liquid, the plurality of pillars forming a fluidic template, dispensing a first liquid into a first region containing the pillars such that liquid spreads only in the first region, dispensing a second liquid into a second region such that liquid spreads in the second region and partially into the first region, forming an overlap region, an extent of the overlap region controlled by the positions of the pillars.

Another embodiment is a structure that has a fluidic template formed from a plurality of pillars, a first layer of a first dispensed material formed in a first region of the fluidic template, a second layer of a second dispensed material formed in a second region of the fluidic template, and an overlap region formed from at least some of the plurality of pillars, the pillars arranged to control an extent of the overlap region, the structure formed from the second layer formed on the first layer.

BRIEF DESCRIPTION OF THE DRAWINGS

Embodiments of the invention may be best understood by reading the disclosure with reference to the drawings, wherein.

DETAILED DESCRIPTION OF THE EMBODIMENTS

Defining printed lines and structures more accurately generally involves fluidic channels to guide the printed liquid. Alternatively, a surface such as of a substrate was patterned with a hydrophilic/hydrophobic coating, generally by stamping. This approach has been done for critical structures in a single electronic layer such as the channel area in a transistor structure.

Other techniques others employ are microchannels or capillaries. For example, "Microcapillaries for Patterning Semiconductors," M. Chabinyc, Advanced Materials, vol. 15, no. 22, 2003) discloses simple capillaries. Shioya, et al., "LTPS TFTs with Metal Electrodes Formed by Ink Jet Printing Technology," SID (Society for Information Display) Digest 2006, pp. 1575-1578., discussed photolithographically patterned channels to confine jet printed silver in thin film transistor (TFT) areas, but uses only a simple channel structure in one layer to confine liquid. Embossing/imprinting a substrate may be used to define a template, as discussed by Taussig, et. al., "Towards Roll-to-Roll Manufacturing of Electronics on Flexible Substrates," USDC presentation (2006). However, this approach does not employ solution processing to deposit electronic materials.

In another approach, surface energy patterned substrates may define fluid paths and spew points. The channel-like fluid paths are defined by forming hydrophobic regions to guide the fluid inside the regions like in a channel, and gaps in the hydrophobic regions form spew points for guidance of overflow of the material. This approach, shown in U.S. patent application Ser. No. 10/793,225, and assigned to Plastic Logic, Ltd. relies upon the hydrophobic/hydrophilic definitions of channels. Most of the current implementations involve microfluidic structures, but the microfluidic structures are limited to microchannels or capillaries. Usually these channels or regions define a fluid pattern in one layer of a more complex circuit or system. The challenge still remains to align several layers accurately to each other, which can be a problem particularly on polymer substrates where distortion or shrinkage can occur.

In contrast, the discussion here focuses on using fluidic templates, patterns of microstructures, other than or in addition to channels, formed on or from a substrate, which guides the deposition of fluids. The fluidic template guides the fluid spreading so that the fluid spreads according to the geometries of the fluidic template. Complex geometries may be therefore achieved without dispensing the fluid in a precise manner to achieve these geometries. The geometries of the fluidic template may include rectangular sections, circular sections, triangular geometries, T-shaped geometries, combinations of rectangular areas, tapered geometries, etc.

In particular, fluids for several circuit layers are guided with the same fluidic template layer. Different fluid guiding for different layers is achieved by introducing discontinuities between areas in the fluidic template and dispensing fluids into the areas separated by discontinuities according to the desired pattern. A discontinuity may be a simple change in the local distance between the microstructures which acts to stop fluid spreading from one area to the neighboring area. The formation of the fluidic patterns can result from deposition, such as photolithographic patterning, molding, printing, stamping embossing or etching into the substrate, or other patterning methods known to one skilled in the art. The driving force in the fluidic templates is the capillary force in microstructures, having behavior known to one skilled in the art.

The fluidic template does not consist of microchannel structures, although those may be used in combination with the fluidic templates described here, but employs pillar or wall-segment-like structures that stop, capture or wick a fluid. The structures may behave like a sponge, evenly distributing a dispensed fluid into a layer. The capillary action relies upon surface energies of the microstructure surfaces, plus properties of the liquids such as viscosity and surface tension, but also depends upon the geometry and spacing of surfaces. The spreading of the fluid also depends on the amount of supplied fluid. Surfactants may also adjust the surface tension of the dispensed liquid, such as to increase spreading. An example of surfactants is the group of Fluorad™ surfactants from 3M Corporation of St Paul, Minn.

Figure 1:
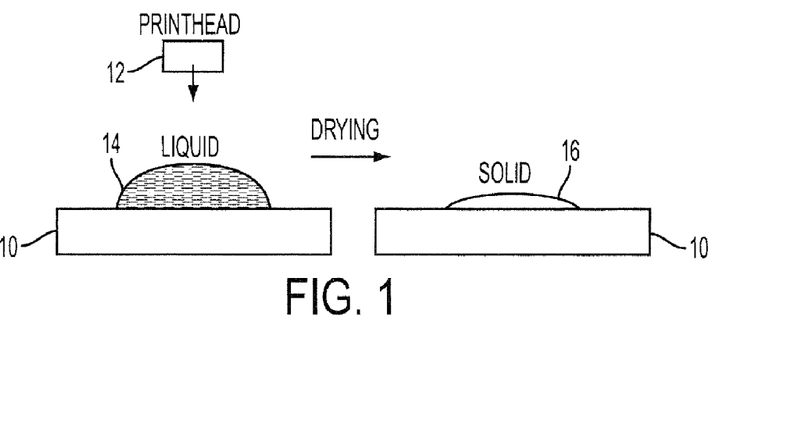
FIG. 1 shows an example of a dispensed fluid as the fluid transitions from liquid to solid.
Figure 2:
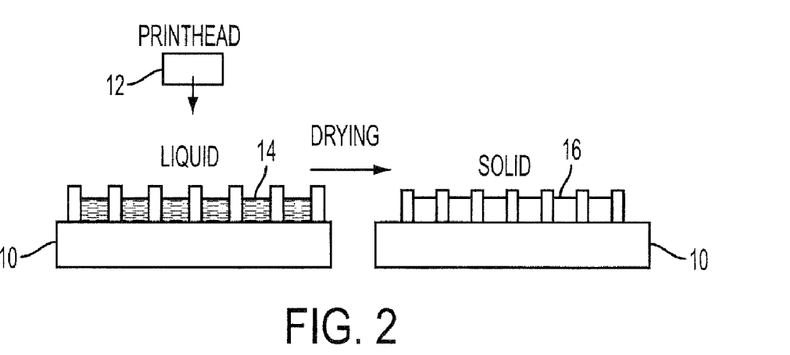
FIG. 2 shows an example of a dispensed fluid in a fluidic template as it transitions from liquid to solid.

FIGS. 1 and 2 compare resulting geometries of a liquid dispensed without a template, as in FIG. 1, and with a template, as in FIG. 2. In FIG. 1, a drop of liquid 14 is dispensed onto a substrate 10 by a printhead 12. It must be noted that many different techniques may dispense the liquid, including jet-printing, dip-pen depositing or printing, and pipetting. After drying of the solvent, the liquid drop 14 has become a solid 16.

In FIG. 2, a fluidic template comprised of an array of pillars such as 18 resides on the substrate prior to dispensing the liquid. When the printhead 12 dispenses the liquid drop 14, it spreads evenly into a relatively uniform layer of liquid, interspersed with the pillars 18. The surface energy of the pillars, the surface energy of the substrate and the spacing of the pillars may be chosen such that spreading occurs due to capillary force. The solid drop 16 has a relatively flat surface and has a profile that is more square on the sides.

Figure 3:
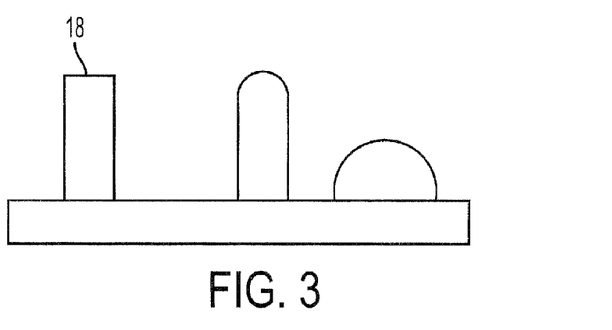
FIG. 3 shows examples of structures that may be used in a fluidic template.

FIG. 3 provides examples of pillar profiles. The selection of the pillars may depend upon the liquids used and the applications. For example, single layer applications may only need short pillars such as that shown on the right, while layered structures, having greater thickness on the substrate may need taller pillars, such as those shown on the left and in the middle. The left pillar has a rectangular top, while the middle pillar has a slightly rounded top, which may prevent poor step coverage if multiple layers are deposited over the pillars. Typical pillar geometries and pillar distances are dependent on the fluid properties such as surface tension and viscosity. At too large dimensions and pillar distances the capillary forces do not have an effect and wicking may not be observed. However, for our applications, a typical pillar height is around 100 nm up to about 1 mm and pillar distances may be around 100 nm up to 500 micrometer, for example. Smaller dimensions are possibly useful if this method is used to pattern micron and submicron size structures.

The pillars may be fabricated by molding, stamping, embossing of materials such as polymer materials or by photolithographic patterning of a material such as the polymer SU-8 (MicroChem Corp.), for example. The pillars may also be etched into the substrate using for example wet or dry etching techniques such as deep reactive ion etching of silicon, for example, or the pillars may be etched into a deposited film on the substrate such as a silicon dioxide or silicon nitride film. The pillars may also be deposited by a printing technique such as flexography or ink-jet printing. Ink-jet printed UV-curable polymer may be one example material for patterning the pillars. In this case the pillar height may be increased by printing several layers on top of each other. Other microfabrication or deposition methods may also be used.

The pillars and substrate may also be coated with a material that adjusts the surface energy, For example, a silane layer may be deposited to turn either the pillars or the substrate or both more hydrophilic or more hydrophobic. A range of silanes is avail for example from Gelest Inc, of Morrisville, Pa. The surface may also be coated with a layer of a polymer, silicon dioxide, silicon nitride or other material with desirable surface energy. With these methods the pillars and the substrate on which they are anchored may consist of the same material or of dissimilar materials and the surface energies of the pillars and the exposed substrate may be the same or they may be different. Ink-jet printing may include piezo ink-jet printing, thermal ink-jet printing, electrostatic ink-jet printing, as examples.

Figure 4:
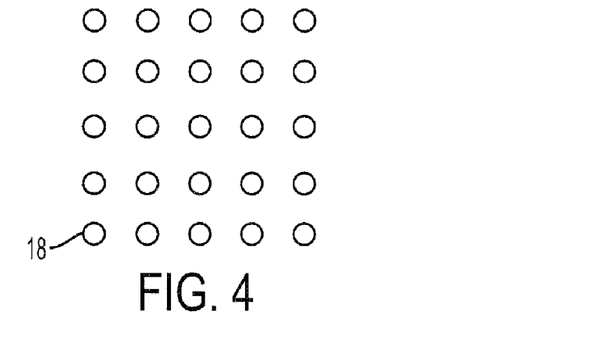
FIGS. 4-6 show an example of a fluidic template for formation of a square printed circuit as it receives a dispensed liquid.
Figure 5:
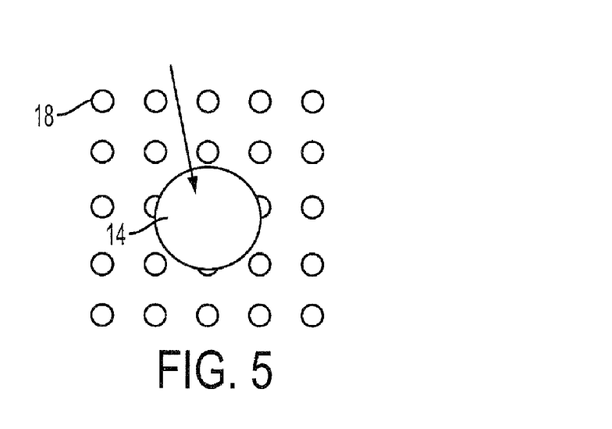
Figure 6:
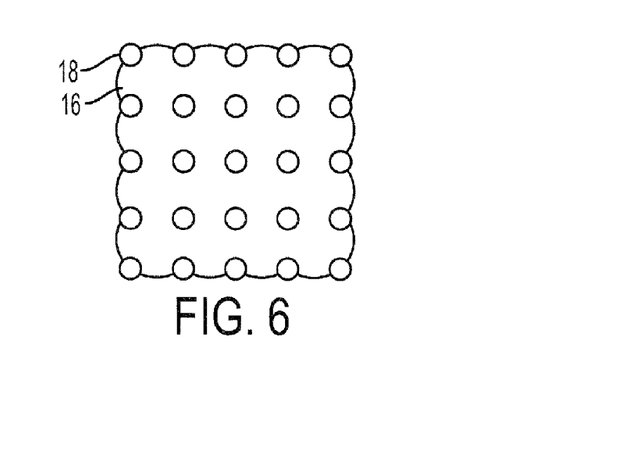

In addition to the geometry of the pillar structures, the geometry of the pattern of pillars is also controllable to cause the dispensed liquid to take on a particular shape. FIGS. 4-6 show an example of liquid dispensed into a fluidic template having a square shape. In the example of FIG. 4, the fluidic template consists of an array of pillars 18 formed into a square.

In FIG. 5, a drop of liquid 14 is dispensed into the fluidic template. As shown in FIG. 6, the liquid spreads to form a mostly square printed structure. As mentioned above, the spacing and the surface energies of the pillars are controlled such that the spreading of the drops is controlled. The natural force of the drop, consisting of the gravitational force on the liquid, possible additional fluidic pressure and the capillary forces, to spread 'runs out' when edges of the drop reach the outside barrier of the fluidic structure.

Accuracy may arise as one issue in ink-jetting liquids to form electronic components. Using a fluidic template as shown in FIGS. 4-6, the ink-jet process does not have to deposit the drop in exactly the center of the targeted area. If the drop lands anywhere in the targeted pillar area, it will spread out as shown in FIG. 6.

The resulting solid form of the drop may be referred to here as a structure. The structure may have very little vertical extent, laying substantially 'flat' on the substrate, and may have multiple layers.

Figure 7:
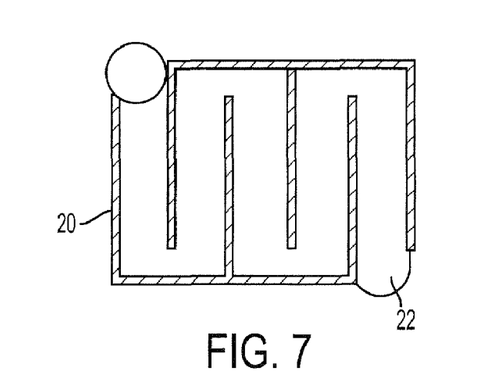
FIG. 7 shows an alternative example of a fluidic template.

In FIG. 7, an alternative fluidic template is used to spread liquid resulting in a well defined rectangular area. A serpentine microchannel, formed by similar microfabrication methods mentioned before guides the liquid into the desired shape. The drop of liquid 14 would be deposited into the inlet of the microchannel structure 20. The liquid will spread until it reaches the 'outlet' of the channel at 22. The outlet region of the channel 22 may also allow neighboring pads to connect to the pad shown in FIG. 7. Channel structures to guide fluid have been used before, and may be combined as 'simpler' structures with areas of the pillar patterns.

Figure 8:
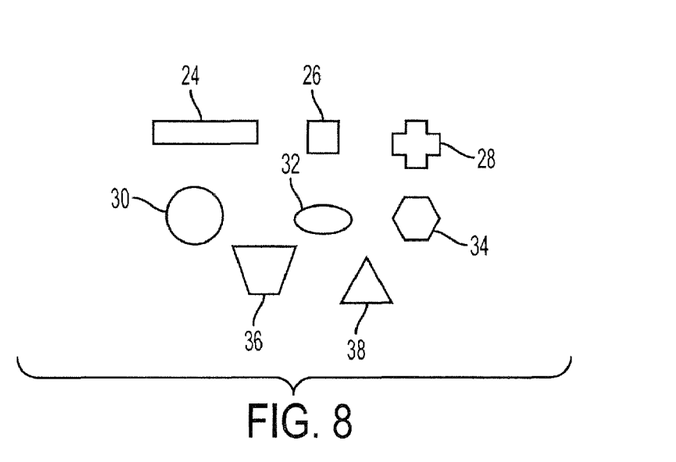
FIG. 8 shows alternative structures for use in a fluidic template.

In addition to varying the profiles of the pillars as in FIG. 3, the patterns of the pillars as in FIGS. 4 and 5, and the structures of the pillars such as the walls in FIG. 7, it is also possible to vary the geometry of the individual pillars, as well as mix up various shapes of pillars to form different fluidic templates. For example, as shown in FIG. 8, the pillars may be rectangular 24, square 26, cross-shaped 28, round 30, oval 32, hexagonal 34, polygonal 36 or triangular 38. Of course other shapes such as T-shaped, curved, etc. are also possible and the depicted shapes are only examples.

Figure 9:
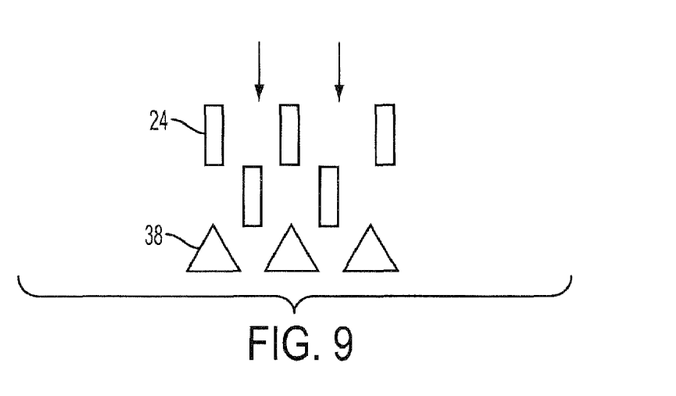
FIG. 9 shows an example of a fluidic template using individual structures.

In FIG. 9, a 'nozzle' type structure is formed from a mix of two different pillar geometries. The rectangular pillars are placed to 'funnel' the liquid towards the triangular pillars such as 38. This structure promotes fluid flow into a particular region with the rectangular pillars acting as channels and then retains the fluid using the triangular pillars. The exact geometry of such a nozzle-type structure depends very much on the viscosity and surface tension of the fluid and on the surface energies of the involved surfaces.

A further variation may occur in the heights of the pillars. Different regions may have pillars of different heights. For example, a substrate may have one region that has pillars of a first height. A second region on the same substrate may have pillars of a second height. The variations in the heights may be related to the viscosity of a particular fluid to be deposited in that region, a desired thickness of the resulting layer, etc.

In experiments, an aqueous solution of silver particles was confined by pillars formed from SU-8 photoresist (manufactured by MicroChem Corp.) on a silicon substrate. The walls used in the experiment stood approximately 40 microns high, 7 microns wide and 30 microns long. The longitudinal spacing of the walls was ~10 microns and the perpendicular spacing was 35 microns. The experiment was repeated on a similar surface conformally coated with polycarbonate. The results were very similar, indicating that that control of the fluidic motion is primarily by the geometrical structure without differences in the surface energy between the pillars and the substrate.

It is possible to form multilayer electronic components using these pillar and wall structures as fluidic templates. FIGS. 10-13 show an example of this. The fluidic template 40 consists of a particular pattern of pillars. A first liquid is dispensed into a first region of the fluidic template, which in this example consists of two rows of pillars. In this particular example, the liquid is dispensed 'inside' the fluidic template, meaning that it is dispensed on the inside of the pattern of pillars. The ink liquid or material 42 spreads out from the initial point to form a layer within the pillars. It must be noted that some of the drop will extend slightly beyond an area defined by the centers of the pillars. The amount by which it extends depends on the fluid properties, the surface energy of the pillars and the amount of fluid dispensed. This allows overlap between multiple layers of materials to create the semiconductor structures. In this example, the first liquid defines the gate metal or conductive layer of a thin-film field effect transistor. The liquid was a dispersion of silver nanoparticles in a water/ethylene-glycol solution (from Cabot Corp.). After drying of the solvent a layer of silver nanoparticles remains which becomes conductive when heated at a temperature around 150 degC. for several minutes. Other fluids may be used to define conductive areas. For example, conductive polymer solutions such as PEDOT:PSS (Baytron (R) from H.C.Starck) may be used or other nanoparticle or precursor solutions that can be turned into conductive material, such as by thermal annealing or laser annealing.

Figure 10:
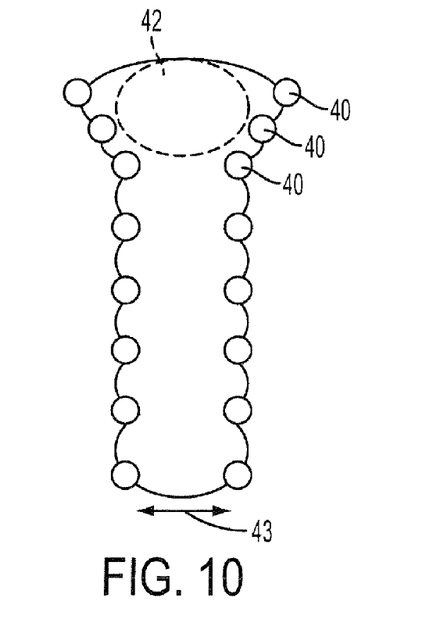
FIGS. 10-12 show a manufacturing process for a multi-layer structure.
Figure 12:
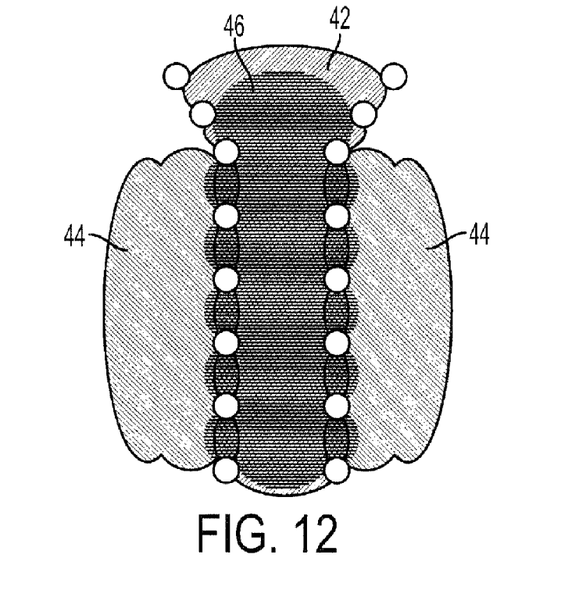

It has to be noted that the width of the gate structure, or lateral pillar spacing, as shown by arrow 43 in FIG. 10 can be narrower than the width of the dispensed drop liquid or material 42. In typical inkjet processes, drop sizes are around 40 micrometers for example. With such a drop size it is impossible to directly print smaller structures such as gate structures that are 20 microns wide, for example. However, FIG. 10 shows that a narrow gate can result by using the template structure although the dispensed drop may be wide. A narrow gate and therefore also a short channel length as in FIG. 12 are important for high performance transistors.

A gate dielectric may then be deposited to provide a conformal coating over the gate layer formed from liquid 42. The gate dielectric deposition may be from any know deposition techniques such as chemical vapor deposition, vapor-phase deposition, spray-coating, dip-coating, etc., or it may be printed such as by jet-printing. If the dielectric is deposited from a solution, it may be based on a polymer such as polyvinylphenol, or SU-8, for example, or a silicon dioxide precursor or it may consist of a stack of self-assembled monolayer molecules. The gate dielectric is usually relatively thin, typically below 1 micron. This thin layer does not bury the pattern of the template, but leaves it 'visible' for subsequent layers, if the template height is higher than the dielectric thickness or if the deposition process leaves a truly conformal dielectric coating. When the gate dielectric is deposited by jet-printing or other localized dispensing methods, the template pattern may also be used to locally guide the dielectric fluid. Different dielectric materials may thus be deposited in different areas. For example an n-type transistor may need a different dielectric from a p-type transistor.

Figure 11:
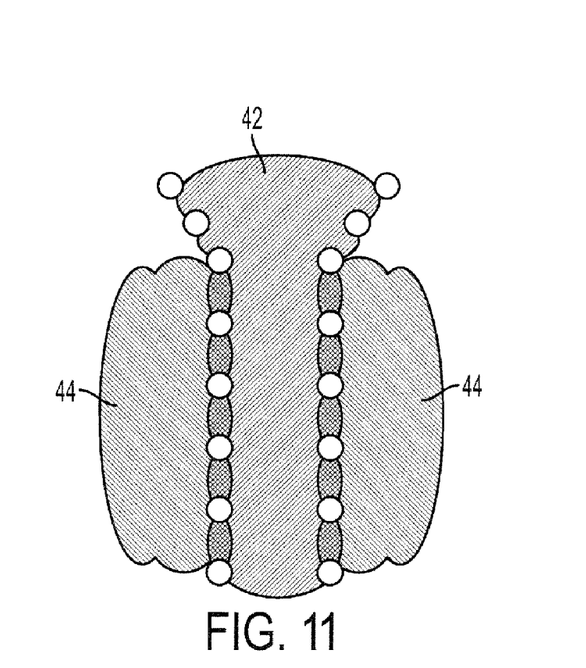

FIG. 11 shows the deposition of the source and drain materials 44, to each side of the gate layer. This may be referred to as being deposited to a second region, where the second region is 'outside' the pattern formed by the pillars. The liquid spreads until it reaches the pillars. Potential liquids are similar to the ones used to form the conductive gate. At the pillars the liquid stops as they act as a pinning point. The gate layer and the source and drain layer overlap in the region around the pillars, allowing the formation of the transistor. For the formation of a transistor it is important that the gate and the source-drain areas slightly overlap. However, the overlap causes a parasitic capacitance which affects the switching speed of the transistor. A small and well defined overlap is usually desired to achieve good and consistent transistor performance.

The fluidic template allows the formation of the overlap regions to rely upon the pillars, their shape and their spacing, rather than relying on the accuracy of the ink-jet printing process. In FIG. 11, the overlap between material 44 and material 42 in between the pillar template 40 could be decreased by choosing pillars with a smaller diameter, for example. A larger diameter would give a larger overlap between the layers. In addition, the gate or channel length is not defined by the printing accuracy but by the template, more particularly the lateral pillar spacing as shown by arrow 43 in FIG. 10. This allows for more precise formation of the electronic components.

To finish the structure formed from the source, drain and gate, the semiconductor material liquid 46 in FIG. 12 is deposited in the first region where the gate liquid 42 was originally formed. Here, the semiconductor material would be a solution of a polymer semiconductor or a precursor for a semiconductor. Example semiconductor solutions include polythiophenes such as PQT-12, pentacene precursor solutions, but also precursor solutions for inorganic semiconductors such as zinc-oxide (ZnO) or copper-indium-telluride. After the solvent has evaporated, the semiconductor or precursor may require annealing at an elevated temperature. The deposition of the semiconductor material occurs very similarly to the deposition of the gate material into the first region. The pillars control the spreading of the material, as well as their shape and their vertical spacing controlling the overlap region of the material layers. This is shown in FIG. 12. In the example of FIG. 12 with round pillars, the overlap region is mainly determined by the diameter of the pillars and the spacing between the pillars, but also the amount of dispensed fluid which controls the spreading force, plays a role. The overlap of the semiconductor with the source and drain metal is essential in order to establish an electrical contact. If no overlap were desired, the pillars may be formed closely together, or a wall structure may be used.

Figure 13:
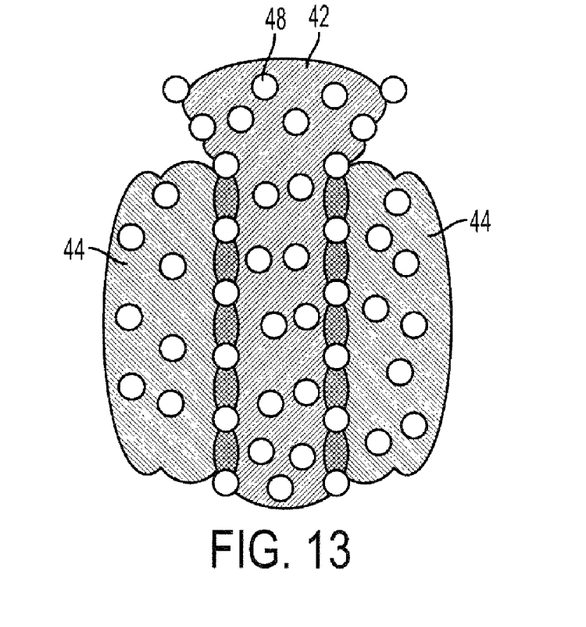
FIG. 13 shows an alternative fluidic template using wicking pillars.

In addition to pillars in the fluidic template defining both the spread of the materials and their overlap regions, other pillars may be used to 'wick' up the dispensed material. Pillars that lie more closely to other pillars promote the spreading of the dispensed liquid. It does not require as much energy for the drop to move from one pillar to the other. If spreading is not desired or if it is to be stopped, the pillars located in the direction of the moving liquid front can be spaced further apart. It is possible to define two different pillar spacings, one is the spacing of neighboring pillars along a liquid front, the other one is the one perpendicular to the liquid front. This is also demonstrated when the pillar spacing transitions from the closer spaced pillars on the interior of the template to the farther spaced pillars. FIG. 13 shows an example of a structure similar to FIG. 11, except that wicking pillars such as 48 have been added to the structure. These pillars may be randomly positioned or they may be arranged in a pattern that is optimized for wicking the fluid. They also may be of different shape, such as a smaller diameter, and they may have a different height such as a smaller height than the main pillars. Wicking pillars may provide even more precise control over the drop spreading process and on the final thickness uniformity of the deposited layer. The wicking process and the stopping of the fluid front by changing the pillar arrangement also depend on the fluid viscosity and surface tension. Moreover, it depends on the force that moves the fluid forward. This force is determined by the amount of fluid deposited into an area.

Figure 14:
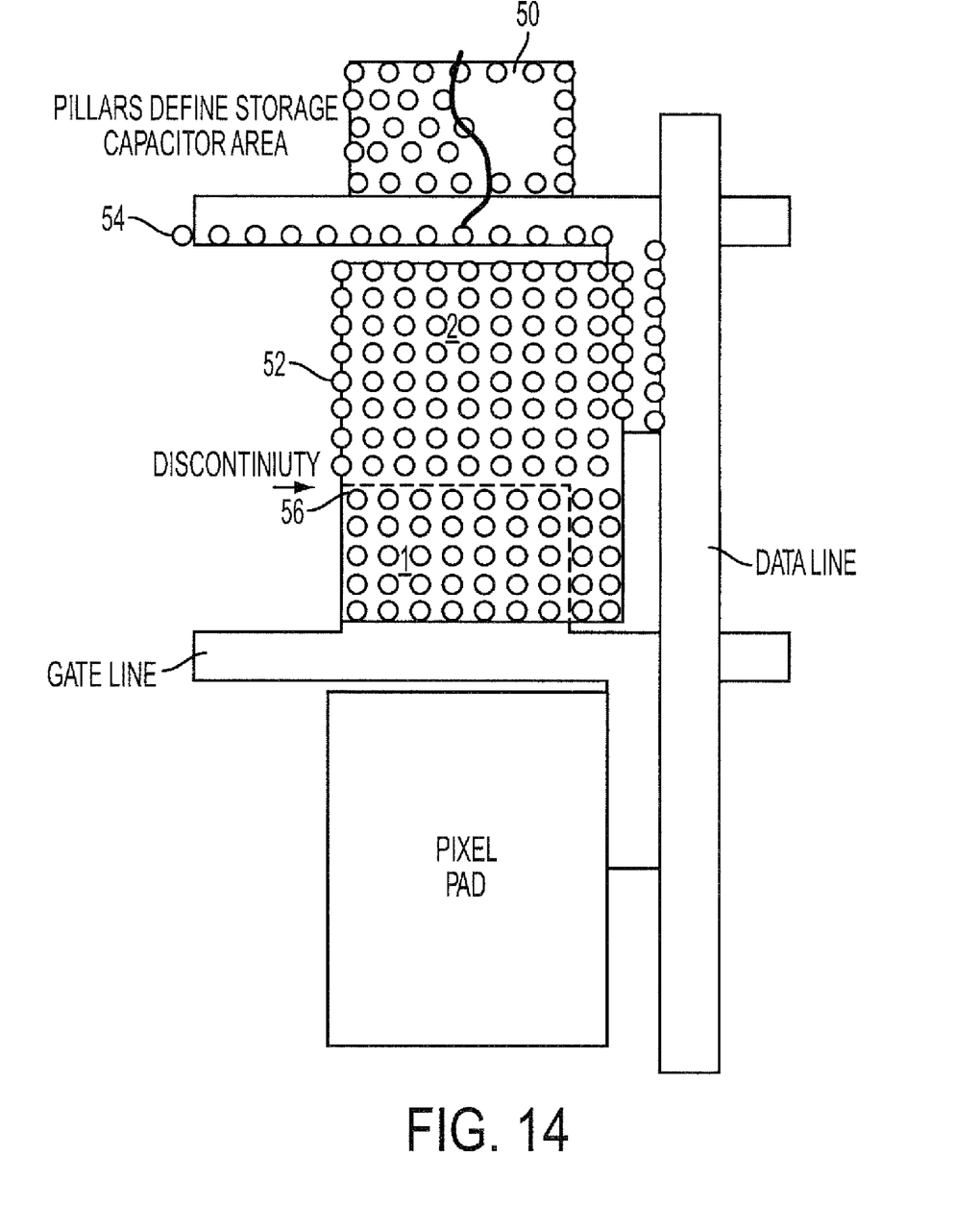
FIG. 14 shows an example of a fluidic template for a pixel structure.

The structures disclosed in FIGS. 4-6, 7 and 12 have single and multiple layers, but are relatively simple. It is possible to use fluidic templates to form more complicated structures. FIG. 14 shows an example of such an electronic structure defining pixels, including pixel capacitors, of an active-matrix pixel circuit. The typical dimensions of the pixels used to drive displays are in the range of tens to hundreds of microns with minimum feature sizes such as the gate length of a transistor being in the range of a few microns. In one example for paper-like display applications a pixel pitch may be around 150-500 microns. The structure in FIG. 14 has several regions, each resulting from variations in the fluidic template.

Pillars such as 18 define the bottom capacitor plate of a storage capacitor region 50. This capacitor region is located on the gate-metal layer which also has patterned gate-lines and transistor gate structures as described in FIG. 10. The gates or gate lines may be simply printed without a template or they may be patterned using a fluid channeling pillar structure similar to the one described in FIG. 10. In order to channel fluid for the gate lines, simple wall structures would be sufficient because a lateral overlap with subsequent layers is not required.

Pillar structures such as described in FIG. 4-6 may define this region, or a fence such as that shown at 54 may define this region. After depositing the gate insulator the source and drain contacts, the data lines and the pixel pads must be patterned. A pixel pad region 52 consists of two regions. One region (1) overlaps with the storage capacitor pad 50 and the other region (2) does not overlap with 50. It is important for the operation of a pixel circuit that the capacitance formed by the overlapping area 1 is similar from pixel to pixel. Here the overlap area is formed by the template area 1 and it therefore does not depend on precise alignment and precise droplet positioning in the printing process for patterning the two layers.

A discontinuity just above pillar 56 in the pillar spacing defines a barrier between the two regions of the pixel pad. The discontinuity here means for example that the pillar spacing between area 1 and area 2 is larger which locally stops the liquid spreading. The discontinuity is only required for defining the area 50 on the gate-metal layer. It prevents the dispensed material from spreading from the lower portion (1) of the pixel pad template to the upper portion (1). For defining the pixel pad, this discontinuity is not required and after dispensing liquid into the areas 1 and 2 the two regions may have to be connected by dispensing additional liquid into the area where the discontinuity is located. The areas 1 and 2 have at their borders also discontinuities or wider pillar distances which stop the liquid flow and therefore defines the edge of the pixel pad. These regions may form a capacitor in region 1 and a region 2 which is connected to a thin-film transistor, the thin-film transistor having been discussed at FIGS. 10-12.

In this manner, it is possible to provide more accurate printed structures with shapes that are more conducive to the formation of electronic components. The accuracy of the structures do not depend upon the accuracy of the dispensing or printing process, but instead depend upon the formation of the fluidic templates. Also, the fluidic template may function as an alignment structure for multiple electronic layers. This allows more precise control over the formation and shape of printed structures within the limitations of an ink jetting process.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method, comprising:
   forming a plurality of pillars, the pillars arranged such that positions of the pillars control flow of a liquid, the plurality of pillars forming a fluidic template;

dispensing the liquid into the fluidic template such that the liquid assumes a shape corresponding to the fluidic template; and drying the liquid to form at least a portion of a patterned structure.

2. The method of claim 1, wherein forming a plurality of pillars comprises forming a plurality of pillars in at least two different, adjacent regions on a same substrate.

3. The method of claim 2, wherein forming a plurality of pillars in at least two different regions comprises forming a first plurality of pillars having a first height in a first region and forming a second plurality of pillars having a second height in a second region.

4. The method of claim 1, wherein forming a plurality of pillars comprises one of ink jet printing the pillars onto a substrate, embossing the pillars into a substrate, photolithographically patterning the pillars, molding the pillars onto a substrate, molding the pillars and a substrate from one material, or etching the pillars into the substrate.

5. The method of claim 1, wherein forming a plurality of pillars comprises:

forming a boundary of a region with a first set of pillars; and forming a second set of pillars within the first region, the second set of pillars arranged to assist in wicking of the liquid.

6. The method of claim 1, wherein dispensing the liquid comprises one of ink jetting the liquid, dispensing the liquid by dip-pens, or pipetting the liquid.

7. The method of claim 1, wherein dispensing the liquid comprises dispensing a liquid containing a surfactant.

8. A method of forming a multi-layer printed structure, comprising:

forming a plurality of pillars, the pillars arranged such that positions of the pillars control flow of a liquid, the plurality of pillars forming a fluidic template;

dispensing a first liquid into a first region containing the pillars such that liquid spreads only in the first region; and dispensing a second liquid into a second region such that liquid spreads in the second region and partially into the first region, forming an overlap region, an extent of the overlap region controlled by at least one of the positions and geometries of the pillars.

9. The method of claim 8, wherein the printed structure comprises an electronic component.

10. The method of claim 9, wherein dispensing the first liquid into the first region comprises dispensing a first liquid into the first region which forms a first conductive layer.

11. The method of claim 10, comprising forming an insulating layer over the first and second regions to form an insulating layer.

12. The method of claim 11, wherein forming an insulating layer comprises one of vapor deposition, dip coating, or spray coating.

13. The method of claim 11, wherein dispensing a second liquid into a second region comprises dispensing a liquid that forms one of either a conductive or a semiconductive layer into the second region such that the overlap region allows overlap between the first and second layers.

14. The method of claim 9, wherein the electronic component comprises a thin film transistor.

15. The method of claim 8, wherein dispensing the first and second liquids comprises one of jet-printing, dip-pen printing, or pipetting.

16. The method of claim 15, wherein jet-printing comprises one of piezo ink jet printing, thermal ink jet printing, or electrostatic ink jet printing.

17. A structure, comprising:

a fluidic template formed from a plurality of pillars;

a first layer of a first dispensed material formed in a first region of the fluidic template;

a second layer of a second dispensed material formed in a second region of the fluidic template; and an overlap region formed adjacent to at least some of the plurality of pillars, the pillars arranged and shaped to control an extent of the overlap region, the structure formed from the second layer formed on the first layer.

18. The structure of claim 17, comprising a third layer of insulating material between the first and second layers in the overlap region.

19. The structure of claim 17, wherein the structure comprises an electronic structure.

20. The structure of claim 17, wherein the first region includes at least some of the pillars arranged in a barrier to control spreading of a first liquid to the second region.

21. The structure of claim 17, comprising a third, semiconducting layer to form a thin-film transistor with the first and second layers.

22. The structure of claim 17 comprising an active-matrix pixel circuit.

* * * * *